US008106290B2

(12) United States Patent
Ito et al.

(10) Patent No.: US 8,106,290 B2
(45) Date of Patent: *Jan. 31, 2012

(54) METHOD FOR MANUFACTURING SINGLE CRYSTAL SILICON SOLAR CELL AND SINGLE CRYSTAL SILICON SOLAR CELL

(75) Inventors: Atsuo Ito, Tokyo (JP); Shoji Akiyama, Gunma (JP); Makoto Kawai, Gunma (JP); Kouichi Tanaka, Gunma (JP); Yuuji Tobisaka, Gunma (JP); Yoshihiro Kubota, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 56 days.

This patent is subject to a terminal disclaimer.

(21) Appl. No.: 12/073,437

(22) Filed: Mar. 5, 2008

(65) Prior Publication Data
US 2009/0007960 A1    Jan. 8, 2009

(30) Foreign Application Priority Data
Mar. 7, 2007   (JP) .................................. 2007-056870

(51) Int. Cl.
H01L 31/00    (2006.01)
H01L 21/00    (2006.01)
(52) U.S. Cl. .......................................... 136/255; 438/72
(58) Field of Classification Search .................. 136/252, 136/255; 438/72; 257/E21.002
See application file for complete search history.

(56) References Cited

U.S. PATENT DOCUMENTS
4,427,839 A * 1/1984 Hall ............................... 136/255
4,773,942 A   9/1988 Hamakawa et al.
4,927,770 A   5/1990 Swanson
(Continued)

FOREIGN PATENT DOCUMENTS
DE    199 36 941 A1    5/2000
(Continued)

OTHER PUBLICATIONS
Takahashi et al., "Taiyo-ko Hatsuden (Photovoltaic Power Generation)," *Morikita Shuppan*, 1980, p. 217, 233.
(Continued)

*Primary Examiner* — Basia Ridley
*Assistant Examiner* — Tamir Ayad
(74) *Attorney, Agent, or Firm* — Oliff & Berridge, PLC

(57) ABSTRACT

A method for manufacturing a single crystal silicon solar cell includes implanting either hydrogen ions or rare-gas ions into a single crystal silicon substrate; bringing the single crystal silicon substrate in close contact with a transparent insulator substrate via a transparent adhesive, with the ion-implanted surface being a bonding surface; curing the transparent adhesive; mechanically delaminating the single crystal silicon substrate to form a single crystal silicon layer; forming a plurality of diffusion areas of a second conductivity type in the delaminated surface side of the single crystal silicon layer, and causing a plurality of areas of a first conductivity type and the plurality of areas of the second conductivity type to be present in the delaminated surface of the single crystal silicon layer; forming each of a plurality of individual electrodes on each one of the plurality of areas of the first conductivity type and on each one of the plurality of areas of the second conductivity type; forming a collector electrode for the plurality of individual electrodes on the plurality of areas of the first conductivity type, and a collector electrode for the plurality of individual electrodes on the plurality of areas of the second conductivity type; and forming a light-reflecting film.

15 Claims, 2 Drawing Sheets

U.S. PATENT DOCUMENTS

| | | | |
|---|---|---|---|
| 5,374,564 A | 12/1994 | Bruel | |
| 5,646,432 A * | 7/1997 | Iwaki et al. | 257/347 |
| 5,665,607 A | 9/1997 | Kawama et al. | |
| 5,811,348 A | 9/1998 | Matsushita et al. | |
| 5,956,571 A * | 9/1999 | Yang | 438/69 |
| 5,972,732 A | 10/1999 | Gee et al. | |
| 5,985,742 A * | 11/1999 | Henley et al. | 438/515 |
| 6,013,563 A | 1/2000 | Henley et al. | |
| 6,048,411 A * | 4/2000 | Henley et al. | 148/33.5 |
| 6,331,208 B1 | 12/2001 | Nishida et al. | |
| 6,391,743 B1 | 5/2002 | Iwane et al. | |
| 6,426,235 B1 | 7/2002 | Matsushita et al. | |
| 6,555,443 B1 | 4/2003 | Artmann et al. | |
| 2002/0011590 A1 | 1/2002 | Nagashima | |
| 2003/0203547 A1 | 10/2003 | Sakaguchi | |
| 2004/0207485 A1 | 10/2004 | Kawachi et al. | |
| 2004/0229444 A1 | 11/2004 | Couillard et al. | |
| 2004/0248379 A1 | 12/2004 | Maleville et al. | |
| 2006/0169316 A1 | 8/2006 | Thomsen et al. | |
| 2008/0121275 A1 | 5/2008 | Ito et al. | |
| 2008/0121278 A1 | 5/2008 | Ito et al. | |
| 2009/0007960 A1 | 1/2009 | Ito et al. | |

FOREIGN PATENT DOCUMENTS

| | | |
|---|---|---|
| EP | 0 971 396 A1 | 1/2000 |
| JP | A-63-287077 | 11/1988 |
| JP | A-5-211128 | 8/1993 |
| JP | A-07-106617 | 4/1995 |
| JP | A-7-226528 | 8/1995 |
| JP | 08-213645 | 8/1996 |
| JP | A-08-213645 | 8/1996 |
| JP | A-9-331077 | 12/1997 |
| JP | A-10-93122 | 4/1998 |
| JP | A-11-004008 | 1/1999 |
| JP | A-2000-150940 | 5/2000 |
| JP | A-2001-111080 | 4/2001 |
| JP | A-2001-189477 | 7/2001 |
| JP | A-2001-217443 | 8/2001 |
| JP | A-2003-017723 | 1/2003 |
| JP | A-2004-304622 | 10/2004 |
| JP | A-2004-342909 | 12/2004 |
| JP | A-2006-295037 | 10/2006 |
| JP | A-2006-324530 | 11/2006 |
| WO | WO 2006/093817 | 9/2006 |

OTHER PUBLICATIONS

Office Action for U.S. Appl. No. 11/976,026; mailed Dec. 24, 2009.
Office Action for U.S. Appl. No. 11/976,020; mailed Jan. 25, 2010.
Office Action for U.S. Appl. No. 11/976,021; mailed Jan. 4, 2010.
Partial Translation of a Japanese Notification of Reasons for Refusal issued on Dec. 8, 2009 for Japanese Application No. 2007-56870; 4pgs.
Apr. 13, 2010 Office Action issued in Chinese Application No. 200710193656.X (with partial translation).
Decision of Refusal for Patent Application No. 2006-294490; mailed Feb. 23, 2010 (with translation).
Oct. 26, 2010 Office Action issued in U.S. Appl. No. 11/984,182.
Oct. 25, 2010 Office Action issued in U.S. Appl. No. 12/076,916.
Jan. 26, 2011 Office Action issued Chinese Application No. 2007101851256 (with translation).
Mar. 9, 2011 Office Action issued in Chinese Patent Application No. 200710185124.1 (with partial Englishlanguage translation).
Mar. 9, 2011 Office Action issued in Chinese Patent Application No. 200710185123.7 (with partial English-language translation).
Shah et al., "Thin-film Silicon Solar Cell Technology", Progress in Photovoltaics: Research and Applications, 2004, pp. 113 142, vol. 12.
May 13, 2011 Extended European Search Report issued in European Application No. 07022106.4.
May 13, 2011 Extended European Search Report issued in European Application No. 07020917.6.
May 13, 2011 Extended European Search Report issued in European Application No. 07020916.8.
May 13, 2011 Extended European Search Report issued in European Application No. 07020918.4.
May 24, 2011 Notification of Reasons for Refusal issued in Japanese Patent Application No. 2006-294553 with partial translation.
May 24, 2011 Notification of Reasons for Refusal issued in Japanese Patent Application No. 2006-294608 with partial translation.
May 24, 2011 Notification of Reasons for Refusal issued in Japanese Patent Application No. 2006-294490 with partial translation.
May 24, 2011 Notification of Reasons for Refusal issued in Japanese Patent Application No. 2006-294605 with partial translation.
Jul. 12, 2011 Office Action issued in U.S. Appl. No. 11/976,020.
Dec. 15, 2010 Japanese Notification of Reasons for Refusal issued in JP-2007-056870 (with Translation).
Dec. 21, 2010 Japanese Outline of a Questioning issued in JP-2006-294490 (with Translation).
Dec. 21, 2010 Japanese Outline of a Questioning issued in JP-2006-294605 (with Translation).
Dec. 21, 2010 Japanese Outline of a Questioning issued in JP-2006-294553 (with Translation).
Dec. 21, 2010 Japanese Outline of a Questioning issued in JP-2006-294608 (with Translation).
Nov. 14, 2011 Office Action issued in U.S. Appl. No. 11/976,026.

* cited by examiner

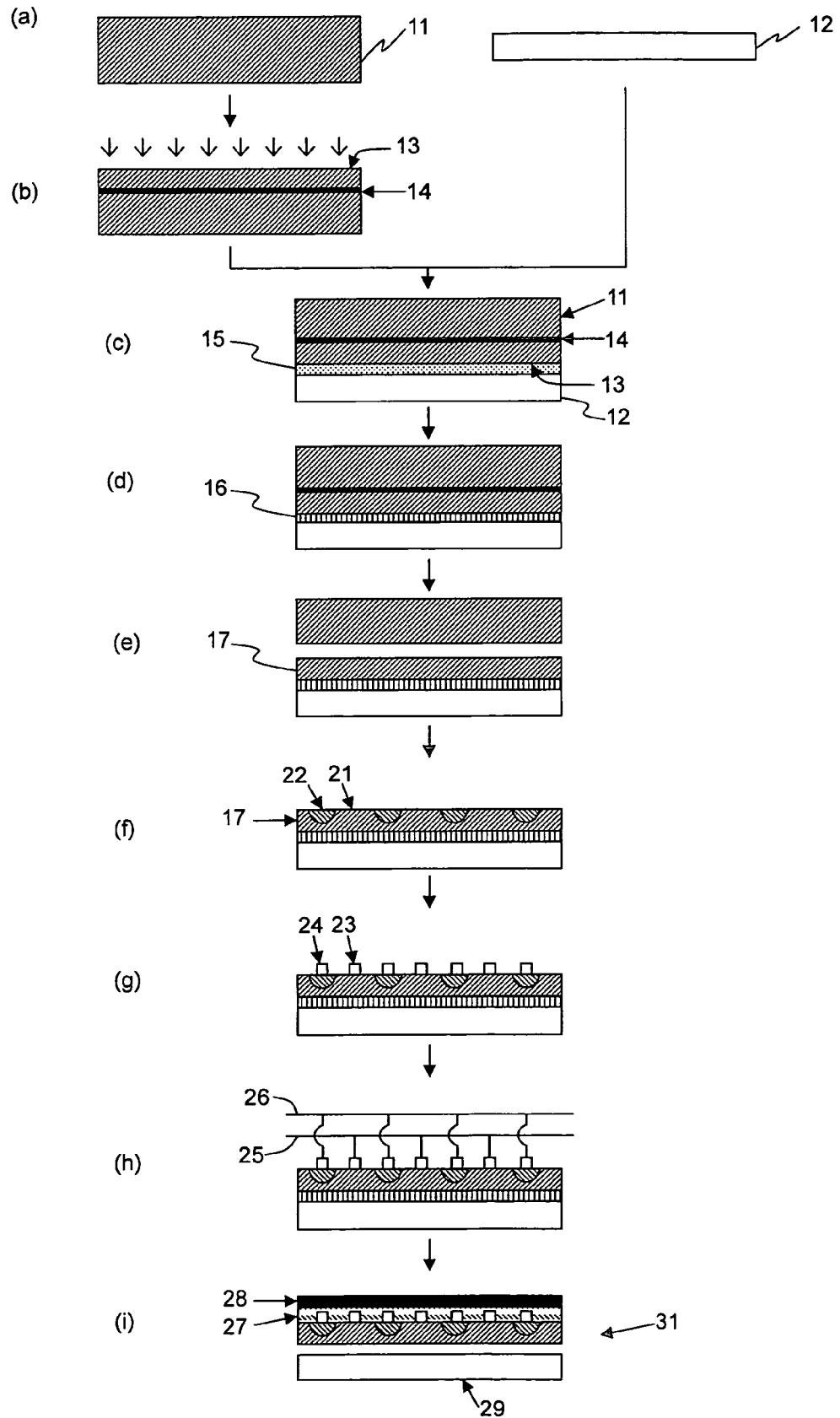
[FIG. 1]

[FIG. 2]
(a)
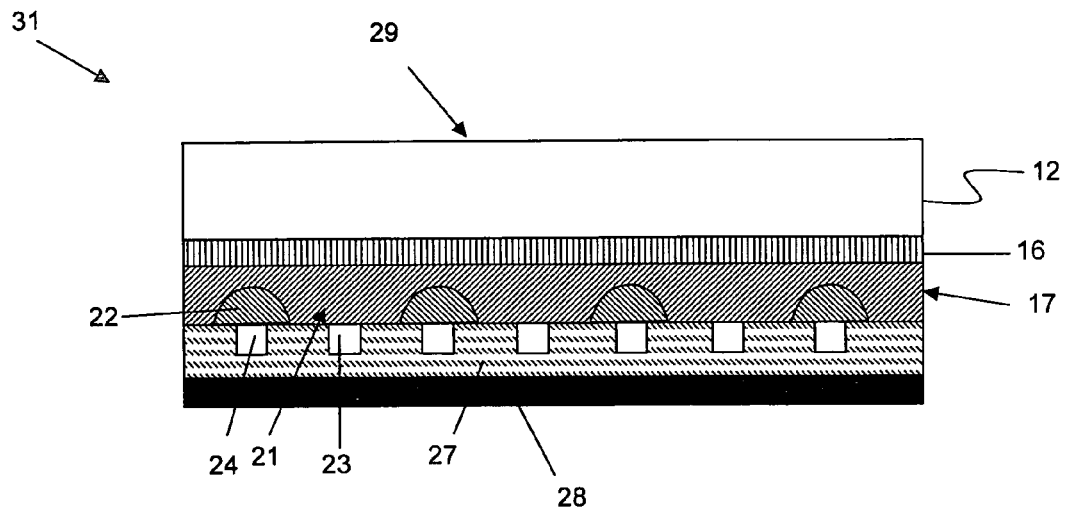
(b)
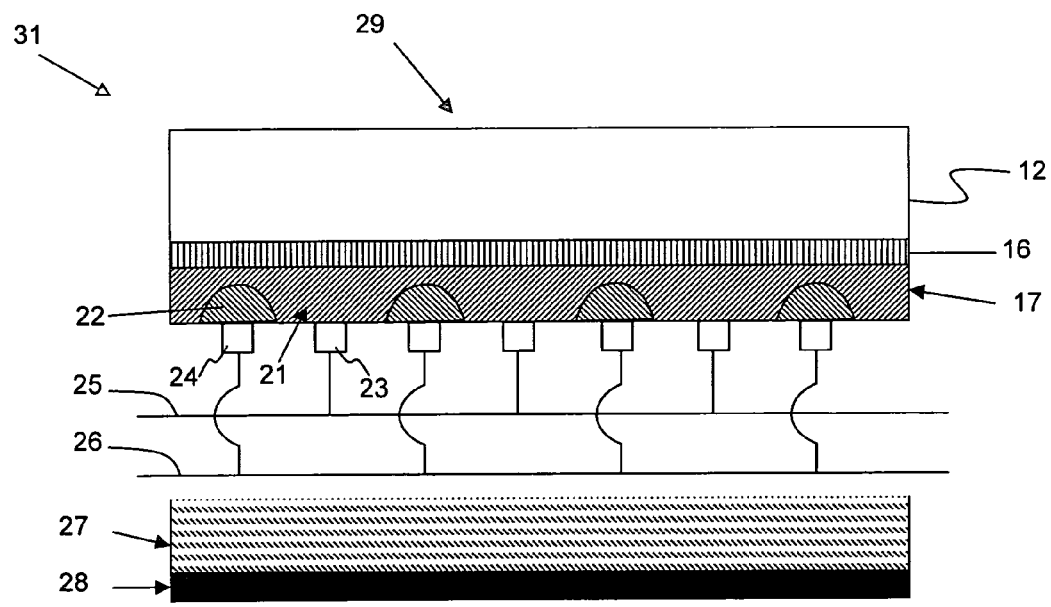

METHOD FOR MANUFACTURING SINGLE CRYSTAL SILICON SOLAR CELL AND SINGLE CRYSTAL SILICON SOLAR CELL

BACKGROUND OF THE INVENTION

1. Field of the Invention

The present invention relates to a method for manufacturing a single crystal silicon solar cell, and a single crystal silicon solar cell.

2. Description of the Related Art

Solar cells produced using silicon as a principal raw material are classified into single crystal silicon solar cells, polycrystal silicon solar cells, and amorphous silicon solar cells, depending on their crystallinity. Among these types, single crystal silicon solar cells are formed by slicing a single crystal ingot obtained by crystal pulling into wafers using a wire saw, processing each wafer to a thickness of 100 to 200 µm, and forming pn junctions, electrodes, a protective film, and the like on the wafer.

Polycrystal silicon solar cells are formed by producing a polycrystal ingot, not by crystal pulling, but by crystallization of molten metal silicon in a die, slicing the polycrystal ingot into wafers using a wire saw as with single crystal silicon solar cells, processing each wafer to a thickness of 100 to 200 µm, and forming pn junctions, electrodes, a protective film, and the like on the wafer as with single crystal silicon solar cells.

Amorphous silicon solar cells are formed by decomposing a silane gas in a gaseous phase through discharge using, for example, a plasma CVD method, to form an amorphous silane film on a substrate, simultaneously performing the steps of forming pn junctions and forming a film by adding diboran, phosphine, or the like to the amorphous silane film as a dopant gas and simultaneously depositing a film, and forming electrodes and a protective film on the substrate. The amorphous silicon solar cells are advantageous in that a sufficient thickness of the amorphous silicon layer is around 1 µm, which is approximately one hundredth that required in crystal solar cells. This is because amorphous silicon absorbs incident light as a direct-transition type material, and therefore, exhibits a light absorption coefficient higher than those of single crystal silicon and polycrystal silicon by approximately one order-of-magnitude (Kiyoshi TAKAHASHI, Yoshihiro HAMAKAWA, and Akio USHIROKAWA, "Taiyo-ko Hatsuden (Photovoltaic Power Generation)", Morikita Shuppan, 1980, p. 233). Given that the amount of power produced by solar batteries worldwide has recently exceeded one gigawatt on an annual basis, and that amount will further increase, there is a high expectation for thin-film amorphous silicon solar cells that allow effective use of resources.

However, the fabrication of amorphous silicon solar cells includes the use of a high-purity gas such as silane, disilane, or the like as a raw material, and part of the gas is deposited on regions other than the substrate inside a plasma CVD apparatus. In view of these circumstances, the effective utilization rate of resources cannot be determined by simple comparison between the required silicon-layer thicknesses in amorphous silicon solar cells and crystal solar cells. Moreover, the conversion efficiency of amorphous silicon solar cells is around 10%, whereas that of crystal solar cells is around 15%. In addition, amorphous silicon solar cells still suffer from deterioration of the output characteristics under light irradiation.

For these reasons, various attempts have been made to develop thin-film solar cells using crystal silicon materials (Kiyoshi TAKAHASHI, Yoshihiro HAMAKAWA, and Akio USHIROKAWA, "Taiyo-ko Hatsuden (Photovoltaic Power Generation)", Morikita Shuppan, 1980, p. 217). One such example is to deposit a polycrystal thin film on an alumina substrate, a graphite substrate, or the like, using trichlorosilane gas, tetrachlorosilane gas, or the like. Since such a deposited film has many crystal defects and lowers the conversion efficiency as it is, it is necessary to improve the crystallinity by zone melting in order to enhance the conversion efficiency (see, for example, Japanese Unexamined Patent Application Publication No. 2004-342909). However, even with such a method employing zone melting, there have been problems such as leakage current at grain boundaries and deterioration of photocurrent response characteristics at long wavelengths due to a shortened lifetime.

SUMMARY OF THE INVENTION

The present invention was accomplished in view of the aforementioned problems. The object of the present invention is to provide a thin-film single crystal silicon solar cell with an optical-confinement structure which allows effective use of silicon as a raw material, exhibits excellent conversion characteristics, has reduced deterioration due to light irradiation, and exhibits a maximum efficiency relative to its thickness; and a method for manufacturing the single crystal silicon solar cell.

In order to achieve the aforementioned object, a first aspect of the present invention provides a method for manufacturing a single crystal silicon solar cell; the single crystal silicon solar cell including a stack having at least a light-reflecting film, a single crystal silicon layer serving as a light-converting film, and a transparent insulator substrate; and a surface of the side of the transparent insulator substrate being a light-receiving surface; the method including at least the steps of preparing a transparent insulator substrate and a single crystal silicon substrate of a first conductivity type; implanting at least either hydrogen ions or rare-gas ions into the single crystal silicon substrate to form an ion-implanted layer; bringing the ion-implanted surface of the single crystal silicon substrate in close contact with the transparent insulator substrate via a transparent adhesive; curing the transparent adhesive to form a transparent adhesive layer, and simultaneously, bonding the single crystal silicon substrate and the transparent insulator substrate; applying an impact to the ion-implanted layer to mechanically delaminate the single crystal silicon substrate, thereby forming a single crystal silicon layer; forming a plurality of diffusion areas of a second conductivity type different from the first conductivity type in the delaminated surface side of the single crystal silicon layer to form a plurality of pn junctions at least in a plane direction of the single crystal silicon layer, and simultaneously, causing a plurality of areas of the first conductivity type and the plurality of areas of the second conductivity type to be present in the delaminated surface of the single crystal silicon layer; forming each of a plurality of first individual electrodes on each one of the plurality of areas of the first conductivity type, and forming each of a plurality of second individual electrodes on each one of the plurality of areas of the second conductivity type in the single crystal silicon layer; forming a first collector electrode for connecting the plurality of first individual electrodes, and a second collector electrode for connecting the plurality of second individual electrodes; and forming a light-reflecting film for covering the plurality of areas of the first conductivity type and the plurality of areas of the second conductivity type.

According to the method for manufacturing a single crystal silicon solar cell including these steps, a thin-film single crystal silicon solar cell with an optical-confinement structure can be manufactured which has a thin-film single crystal silicon layer as a light-converting layer, and a light-reflecting film on an opposite side to a light-receiving surface. The thin-film single crystal silicon solar cell uses the single crystal silicon layer as a light-converting layer, and thereby exhibits a high conversion efficiency relative to its thickness and reduced deterioration due to light irradiation.

Also, the single crystal silicon layer serving as a light-converting layer is formed by delamination of the single crystal silicon substrate, thereby increasing the crystallinity of the single crystal silicon layer. As a result, the conversion efficiency of the solar cell can further be enhanced.

Moreover, the use of a transparent adhesive in bonding the single crystal silicon substrate and the transparent insulator substrate enables these two substrates to be firmly bonded. Therefore, sufficiently firm bonding can be obtained without the application of a high-temperature heat treatment to increase the bonding strength. In addition, because the bonding surfaces are thus firmly bonded, an impact can be subsequently applied to the ion-implanted layer to mechanically delaminate the single crystal silicon substrate, thereby forming a thin single crystal silicon layer on the transparent insulator substrate. Thus, the single crystal silicon layer can be made thin without any heat treatment for delamination.

Moreover, the single crystal silicon substrate is delaminated not by heating but by mechanical means to form a single crystal silicon layer, so as to prevent cracks or defects from being introduced in the light-converting layer due to a difference between the thermal expansion coefficients of the two substrates.

In addition, the thin-film solar cell has a thin silicon layer, which saves the amount of the silicon raw material while allowing effective use thereof.

Furthermore, the absence of any electrode on the light-receiving surface side allows the light absorption efficiency at the single crystal silicon layer to increase, resulting in a further enhancement in the conversion efficiency of the solar cell.

The transparent insulator substrate is preferably composed of any of quartz glass, crystallized glass, borosilicate glass, and soda-lime glass.

When the transparent insulator substrate is thus composed of any of quartz glass, crystallized glass, borosilicate glass, and soda-lime glass, it exhibits satisfactory optical properties, thus facilitating the fabrication of an optical-confinement-type thin-film single crystal silicon solar cell having a transparent light-receiving surface.

The transparent adhesive preferably contains at least one resin selected from the group consisting of silicone resin, acrylic resin, cycloaliphatic acrylic resin, liquid crystal polymer, polycarbonate, and polyethylene terephthalate.

When the transparent adhesive thus contains at least one resin selected from the group consisting of silicone resin, acrylic resin, cycloaliphatic acrylic resin, liquid crystal polymer, polycarbonate, and polyethylene terephthalate, it exhibits excellent visible-light transmittance while functioning as an adhesive, thus forming a satisfactory transparent adhesive layer.

The ion-implanted layer preferably has a depth of not less than 2 μm and not more than 50 μm from the ion-implanted surface.

When the ion-implanted layer thus has a depth of not less than 2 μm and not more than 50 μm from the ion-implanted surface, the thickness of the single crystal silicon layer serving as a light-converting layer of the resulting single crystal silicon solar cell can be about not less than 2 μm and not more than 50 μm. Also, the thin-film single crystal silicon solar cell having a thin-film single crystal silicon layer with a thickness within that range provides practical conversion efficiency as a thin-film single crystal silicon solar cell, while saving the amount of the silicon raw material used.

Preferably, an interior of the transparent insulator substrate or a surface of the transparent insulator substrate opposite to a surface bonded to the single crystal silicon substrate is capable of scattering light; the surface of the transparent insulator substrate bonded to the single crystal silicon substrate is capable of scattering light; or the transparent adhesive, when cured to form the transparent adhesive layer, is capable of scattering light.

In this manner, when an interior of the transparent insulator substrate or a surface of the transparent insulator substrate opposite to a surface bonded to the single crystal silicon substrate is capable of scattering light; the surface of the transparent insulator substrate bonded to the single crystal silicon substrate is capable of scattering light; or the transparent adhesive, when cured to form the transparent adhesive layer, is capable of scattering light; the optical path length of the light incident on the single crystal silicon layer serving as a light-converting layer can further be extended, resulting in a thin-film single crystal silicon solar cell with an optical-confinement structure, in which more light can be absorbed by the single crystal silicon layer as a light-converting layer. As a result, the conversion efficiency can further be enhanced.

A second aspect of the present invention provides a single crystal silicon solar cell which is manufactured according to any of the methods as defined above.

In the single crystal silicon solar cell manufactured according to any of the methods as defined above, the single crystal silicon layer serving as a light-converting layer exhibits a high degree of crystallinity, because it is formed by delaminating the single crystal silicon substrate not by heating but by mechanical means. The thin-film solar cell therefore exhibits a high conversion efficiency relative to its thickness.

A third aspect of the present invention provides a single crystal silicon solar cell including a stack having at least a light-reflecting film, a single crystal silicon layer, a transparent adhesive layer, and a transparent insulator substrate; a plurality of areas of a first conductivity type and a plurality of areas of a second conductivity type formed in a surface of the single crystal silicon layer near the light-reflecting film; a plurality of pn junctions formed at least in a plane direction of the single crystal silicon layer; a plurality of first individual electrodes, each being formed on each one of the plurality of areas of the first conductivity type in the single crystal silicon layer, and a plurality of second individual electrodes, each being formed on each one of the plurality of areas of the second conductivity type in the single crystal silicon layer; and a first collector electrode for connecting the plurality of first individual electrodes and a second collector electrode for connecting the plurality of second individual electrodes.

The single crystal silicon solar cell has an optical-confinement structure, and includes a thin-film single crystal silicon layer as a light-converting layer and a light-reflecting film on an opposite side to the light-receiving surface. Because the thin-film single crystal silicon solar cell uses the single crystal silicon layer as a light-converting layer, it exhibits a high conversion efficiency relative to its thickness and reduced deterioration due to light irradiation.

Furthermore, the absence of any electrode on the light-receiving surface side allows the light absorption efficiency at the single crystal silicon layer to increase, resulting in a further enhancement in the conversion efficiency of the solar cell.

In this case, the transparent insulator substrate is preferably composed of any of quartz glass, crystallized glass, borosilicate glass, and soda-lime glass.

When the transparent insulator substrate is thus composed of any of quartz glass, crystallized glass, borosilicate glass, and soda-lime glass, it exhibits satisfactory optical properties and thereby increases the transparency of the light-receiving surface, thus allowing more light to be absorbed by the single crystal silicon layer as a light-converting layer.

The transparent adhesive layer preferably contains at least one resin selected from the group consisting of silicone resin, acrylic resin, cycloaliphatic acrylic resin, liquid crystal polymer, polycarbonate, and polyethylene terephthalate.

When the transparent adhesive layer thus contains at least one resin selected from the group consisting of silicone resin, acrylic resin, cycloaliphatic acrylic resin, liquid crystal polymer, polycarbonate, and polyethylene terephthalate, it exhibits excellent visible-light transmittance, thus forming a satisfactory transparent adhesive layer.

The thickness of the single crystal silicon layer is preferably not less than 2 μm and not more than 50 μm.

When the single crystal silicon layer thus has a thickness of not less than 2 μm and not more than 50 μm, the resulting thin-film single crystal silicon solar cell provides practical conversion efficiency as a single crystal silicon solar cell, while saving the amount of the silicon raw material used.

Preferably, an interior of the transparent insulator substrate or a surface of the transparent insulator substrate opposite to a surface near the single crystal silicon layer is capable of scattering light; the surface of the transparent insulator substrate near the single crystal silicon layer is capable of scattering light; or the transparent adhesive layer is capable of scattering light.

In this manner, when an interior of the transparent insulator substrate or a surface thereof opposite to a surface near the single crystal silicon layer is capable of scattering light; the surface of the transparent insulator substrate near the single crystal silicon layer is capable of scattering light; or the transparent adhesive layer is capable of scattering light; the optical path length of the light incident on the single crystal silicon layer serving as a light-converting layer can further be extended, resulting in a thin-film single crystal silicon solar cell with an optical-confinement structure, in which more light can be absorbed by the single crystal silicon layer as a light-converting layer. As a result, the conversion efficiency can further be enhanced.

Using the method for manufacturing a single crystal silicon solar cell according to the invention, an optical-confinement-type thin-film solar cell having a single crystal silicon layer that exhibits satisfactory crystallinity and high conversion efficiency as a light-converting layer can be manufactured.

Also, the single crystal silicon solar cell according to the invention is an optical-confinement-type solar cell that uses a single crystal silicon layer as a light-converting layer, and therefore, exhibits high conversion efficiency relative to its thickness.

BRIEF DESCRIPTION OF THE DRAWINGS

FIG. 1 is a flowchart showing an example of a method for manufacturing a single crystal silicon solar cell in accordance with the present invention; and FIGS. 2 (a) and (b) are schematic cross-sectional views of an example of a single crystal silicon solar cell in accordance with the present invention; FIG. 2 (a) is a schematic cross-sectional view excluding the collector electrodes; and FIG. 2 (b) is a schematic cross-sectional view illustrating how the collector electrodes are connected.

DETAILED DESCRIPTION OF THE PREFERRED EMBODIMENTS

As described above, a higher conversion efficiency is demanded also for thin-film solar cells that can save the amount of silicon as a raw material; hence, there has been a demand to improve the crystallinity of crystal solar cells.

The present inventors conducted a study on this object, and consequently found that the crystallinity of a silicon layer serving as a light-converting layer can be increased by, subsequent to bonding a single crystal silicon substrate and a transparent insulator substrate, making the single crystal silicon substrate thinner. The inventors also obtained the following findings. When a transparent adhesive is used in bonding the single crystal silicon substrate and the transparent insulator substrate and then the adhesive is cured, the bonding strength can be increased without a high-temperature heat treatment. Also, satisfactory crystallinity of the single crystal silicon layer can be maintained by mechanically delaminating the single crystal silicon substrate without a high-temperature heat treatment. Moreover, when the thin-film single crystal silicon layer is used as a light-converting layer, it is not necessarily essential to form the pn junction interface in parallel to the light-receiving surface, and the pn junction interface can also be formed perpendicular to the light-receiving surface, to form a structure through which photovoltaic power can be produced. In addition, this structure obviates the need to form any electrode on the light-receiving surface, thus allowing more light to be absorbed by the light-converting layer. The present invention was accomplished based on these findings.

Embodiments of the present invention will be described in detail below; however, the invention is not limited to these embodiments.

FIG. 1 is a flowchart showing an example of a method for manufacturing a single crystal silicon solar cell in accordance with the invention.

A single crystal silicon substrate 11 and a transparent insulator substrate 12 are first prepared (Step a).

The single crystal silicon substrate is not particularly limited, and may, for example, be a single crystal silicon substrate that is obtained by slicing a single crystal grown by the Czochralski process, and has, for example, a diameter of 100 to 300 mm, the p- or n-type conductivity, and a specific resistance of about 0.1 to 20 Ω·cm. The thickness of the substrate 11 is not also particularly limited, and may, for example, be from about 500 to 2000 μm.

The material of the transparent insulator substrate is selected from quartz glass, crystallized glass, borosilicate glass, soda-lime glass, and the like. Although the material is not limited to these examples, it preferably has high transparency to light absorbed by the single crystal silicon. In addition, white glass, tempered glass, or the like may also be used. When the transparent insulator substrate is composed of soda-lime glass, which is widely used as a glass material, a silicon oxide coating, a tin oxide coating (Nesa film), or the like may be formed on surfaces of the substrate by a dip coating process. These coatings are preferable because they serve as buffer films to prevent the alkali metal components in soda-lime glass from eluting and diffusing into the surface.

Next, at least either hydrogen ions or rare-gas ions are implanted into the single crystal silicon substrate 11 to form an ion-implanted layer 14 (Step b).

For example, with the temperature of the single crystal silicon substrate being set to 200 to 450° C., a predetermined dose of at least either hydrogen ions or rare-gas ions is implanted into a surface 13 of the substrate at an energy level such that the ion-implanted layer 14 can be formed at a depth that corresponds to a desired thickness of the single crystal silicon layer, for example, at a depth of not less than 2 μm and not more than 50 μm. In this case, the use of hydrogen ions is particularly preferable because they can be implanted deeper into the ion-implanted surface 13 at the equal energy level, owing to their lightness. Hydrogen ions may be positively or negatively charged, and may be hydrogen-gas ions as well as atomic ions. Also in the case of rare-gas ions, they may be positively or negatively charged.

Moreover, when an insulating film such as a thin silicon oxide film, through which ion implantation is performed, is previously formed on the surface of the single crystal silicon substrate, channeling of implanted ions can be reduced.

The single crystal silicon substrate 11 is then brought into close contact with the transparent insulator substrate 12 via a transparent adhesive 15, with the ion-implanted surface 13 being a bonding surface (Step c).

Resin with high transmittance to visible light is preferably used as transparent adhesives, such as acrylic resin, cycloaliphatic acrylic resin, silicone resin, liquid crystal polymer, polycarbonate, polyethylene terephthalate, and the like. Although the transparent adhesive used is not limited to these examples, it preferably has a visible-light transmittance of 80% or higher. The single crystal silicon substrate and the transparent insulator substrate are then brought into close contact via the transparent adhesive.

Specifically, for example, a transparent adhesive layer is first formed on a bonding surface of at least one of the single crystal silicon substrate and the transparent insulator substrate. The transparent adhesive layer can be formed by a process selected from coating processes such as slit-die coating, dip coating, and the like. The single crystal silicon substrate and the transparent insulator substrate are then brought into close contact via the transparent adhesive layer.

The transparent adhesive 15 is then cured to form a transparent adhesive layer 16, and simultaneously, the single crystal silicon substrate 11 and the transparent insulator substrate 12 are bonded (Step d).

The method of curing the transparent adhesive is not particularly limited, and may be suitably selected according to the material. As well as various polymerization reactions, the transparent adhesive may be cured by, for example, a method that includes softening the adhesive by heating it to about 250° C., and then re-cooling the cured adhesive, a method of volatilizing the solvent, and the like. In this manner, the single crystal silicon substrate and the transparent insulator substrate are firmly bonded. Note, however, that the curing process should be performed at room temperature to around 250° C., and a heat treatment at 300° C. or higher must be avoided. This is because if a high-temperature heat treatment at 300° C. or higher is performed with the single crystal silicon substrate 11 and the transparent insulator substrate 12 being bonded to each other, thermal strains, cracking, delamination, and the like may occur because of the difference between the thermal expansion coefficients of the two substrates. A high-temperature heat treatment at 300° C. or higher must similarly be avoided until the completion of delamination and transfer of the single crystal silicon substrate 11 at Step e explained below.

An impact is then applied to the ion-implanted layer 14 to mechanically delaminate the single crystal silicon substrate 11, thus forming a single crystal silicon layer 17 (Step e).

In the invention, mechanical delamination is performed by the application of an impact to the ion-implanted layer, so that there is no potential thermal strains, cracking, delamination, and the like due to heating. In order to apply an impact to the ion-implanted layer, for example, a jet of a fluid such as a gas or liquid may be continuously or intermittently directed toward side surfaces of the bonded wafer. The method, however, is not particularly limited as long as it can cause mechanical delamination through the application of an impact.

Note that mechanical delamination of the single crystal silicon substrate is preferably performed with a first auxiliary substrate being in close contact with a rear surface of the transparent insulator substrate, and a second auxiliary substrate being in close contact with a rear surface of the single crystal silicon substrate. The use of such auxiliary substrates during the mechanical delamination prevents minute cracks due to warping and accompanying crystal defects from being formed in the single crystal silicon layer 17 obtained after delamination and transfer, thereby preventing a decrease in the conversion efficiency of the resulting solar cell. When both the substrates have a thickness as small as 1 mm or less, the effect obtained using this technique will become significant. For example, when the transparent insulator substrate is composed of soda-lime glass with a thickness of 0.7 mm, delamination may be performed using an auxiliary substrate similarly composed of soda-lime glass, thus making the total thickness of the substrate 1 mm or more.

Moreover, after the delamination and transfer of the single crystal silicon substrate, a heat treatment may be performed to recover the damage due to ion implantation near the surface of the single crystal silicon layer 17. At this point, the single crystal silicon substrate 11 has already become a thin single crystal silicon layer 17 as a result of delamination and transfer. Therefore, even if a heat treatment at 300° C. or higher is applied to a region near the surface of the layer 17, new cracks or accompanying defects will hardly be introduced. This also applies to the steps thereafter.

Then, a plurality of diffusion areas 22 of a second conductivity type, which are different from a first conductivity type of the single crystal silicon substrate prepared in Step a, are formed on the delaminated surface of the single crystal silicon layer 17. At this time, a plurality of pn junctions are formed at least in the plane direction of the single crystal silicon layer (the normal to the pn junction interface at least has a component facing in the plane direction of the single crystal silicon layer 17), and simultaneously, a plurality of areas 21 of the first conductivity type and the plurality of areas 22 of the second conductivity type are present in the delaminated surface of the single crystal silicon layer 17 (Step f).

When the single crystal silicon substrate 11 prepared in Step a is composed of p-type single crystal silicon, the p-type corresponds to the first conductivity type, so n-type diffusion areas are formed as areas of the second conductivity type. On the other hand, when the single crystal silicon substrate 11 is composed of n-type single crystal silicon, the n-type corresponds to the first conductivity type, so p-type diffusion areas are formed as areas of the second conductivity type. Specifically, the plurality of diffusion areas of the second conductivity type can be formed in the following manner. When the single crystal silicon substrate 11 prepared at Step a is the p-type, phosphorus ions are implanted into a plurality of areas on the surface of the single crystal silicon layer 17 (for example, a plurality of areas in parallel) by an ion implantation process. The ion-implanted areas are then subjected to, for example, flash-lamp annealing or ultraviolet or deep-ultraviolet laser radiation with a high absorption coefficient at the surface of the single crystal silicon layer, thereby activating the donors and forming a plurality of pn junctions. At this time, it is preferable to appropriately adjust the ion dose, diffusion time, diffusion temperature, and like conditions, so as to prevent the plurality of n-type diffusion areas from overlapping and forming a single area. Moreover, the plurality of pn junctions may also be formed as follows. A pasty composition containing donor-forming phosphorus is prepared. The composition is then applied to a plurality of areas on the surface of the single crystal silicon layer 17 (for example, a plurality of areas in parallel) by, for example, a screen printing method. The plurality of areas are then diffused and activated using, for example, flash-lamp annealing, ultraviolet or deep-ultraviolet laser radiation with a high absorption coefficient at the surface of the single crystal silicon layer, or an infrared heating furnace.

Note that the areas 22 of the second-conductivity type may be formed so as to reach the bonding interface of the single crystal silicon layer 17 with the transparent insulator substrate 12.

Moreover, when forming the plurality of diffusion areas of the second conductivity type, high-concentration diffusion areas of the first conductivity type may simultaneously be formed so that each diffusion area is present between diffusion areas of the second conductivity type. For example, when n-type diffusion areas are formed by diffusing phosphorus or the like on a plurality of areas on the p-type silicon substrate, an acceptor-forming element such as boron or the like may be diffused and activated in the same manner as described above to form a plurality of $p^+$ areas, each of which is present between n-type diffusion areas.

In the next step, each of a plurality of first individual electrodes 23 is formed on each one of the plurality of areas 21 of the first conductivity type, and each of a plurality of second individual electrodes 24 is formed on each one of the plurality of areas 22 of the second conductivity type in the single crystal silicon layer 17 (Step g).

It is accomplished, by, for example, subjecting the surface of the single crystal silicon layer 17 to a vacuum evaporation method, a chemical sputtering method, or the like, using a metal or a transparent conductive material, to form each of the plurality of the first individual electrodes 23 on each one of the plurality of areas 21 of first conductivity type and form each of the plurality of the second individual electrodes 24 on each one of the plurality of areas 22 of the second conductivity type. Various known methods may also be employed. For example, a pasty composition for forming individual electrodes, which contains a metal or the like, may be applied to the predetermined areas by a printing method, and then the composition-applied areas may be cured by a heat treatment.

At this time, care should be taken that the first individual electrodes 23 are not bonded to the areas 22 of the second conductivity type, and the second individual electrodes 24 are not bonded to the areas 21 of the first conductivity type.

Note that Step f of forming diffusion areas and Step g of forming individual electrodes can be performed simultaneously, as follows. An electrode-forming composition containing a donor- or an acceptor-forming dopant material may be applied to the predetermined areas by a printing or ink-jet method, and then a heat treatment may be performed. In this manner, a plurality of electrodes can be formed by curing, and simultaneously, the dopant can also be diffused. In this case also, the heat treatment can be performed using, for example, flash-lamp annealing, ultraviolet or deep-ultraviolet laser radiation with a high absorption coefficient at the surface of the single crystal silicon layer, or an infrared heating furnace, as described above.

The composition for forming individual electrodes can be applied at an interval of 10 µm or more, or at an interval of 100 µm or more. The single crystal silicon layer 17 of the invention does not have any grain boundary, and exhibits a photocarrier mobility and a lifetime equal to those of a typical single crystal silicon substrate. Therefore, the composition for forming individual electrodes can be applied at an interval greater than that on a polycrystal silicon thin film or an amorphous silicon thin film.

Then, a first collector electrode 25 for connecting the plurality of first individual electrodes 23 and a second collector electrode 26 for connecting the plurality of second individual electrodes 24 are formed (Step h).

The connections may be made in any suitable manner, provided that the first collector electrode 25 does not contact the areas 22 of the second conductivity type and the second individual electrodes 24, and the second collector electrode 26 does not contact the areas 21 of the first conductivity type and the first individual electrodes 23.

The formation of the first collector electrode 25 and the second collector electrode 26 enables electrons and holes collected at the plurality of first individual electrodes 23 and the plurality of second individual electrodes 24 to be efficiently obtained.

A light-reflecting film 28 is then formed so as to cover the plurality of areas 21 of the first conductivity type and the plurality of areas 22 of the second conductivity type (Step i).

The light-reflecting film 28 is formed so as to prevent a short circuit between the first individual electrodes 23 and the first collector electrode 25, and between the second individual electrodes 24 and the second collector electrode 26. When the light-reflecting film is composed of a metal such as aluminum, a transparent seal layer 27 composed of silicon oxide, silicon nitride, or the like is formed so that each type of the electrodes formed on the single crystal silicon layer 17 is embedded therein. A metal film is then formed on the seal layer 27 as a light-reflecting film 28. When the light-reflecting film is composed of an insulating material, a light-reflecting film 28 may be formed so that each type of the electrodes formed on the single crystal silicon layer 17 is embedded therein. Note that the illustration of the first collector electrode 25 and the second collector electrode 26 is omitted in FIG. 1 (*i*).

A material with a visible-light reflectivity of 80% or higher is preferably used as the light-reflecting film 28.

The method of forming the seal layer 27 and the light-reflecting film 28 is not particularly limited. For example, a seal layer 27 may be formed by a deposition method such as sputtering or the like, and then a light-reflecting film 28 may be formed by forming a metal film on the seal layer 27 by deposition, or by bonding a metal film to the seal layer 27.

The single crystal silicon solar cell thus prepared according to Steps a to i is a thin-film single crystal silicon solar cell 31 which is free of potential thermal strains, delamination, cracks, and the like formed during the fabrication, has a thin, satisfactory uniform thickness, and has a single crystal silicon layer with excellent crystallinity. Note that a surface of the side of the transparent insulator substrate 12 corresponds to a light-receiving surface 29.

Thus, light enters through the surface of the transparent insulator substrate 12. One means to enhance the conversion efficiency of solar cells is to cause light to be scattered on the light entry surface. The light entry surface can be made capable of scattering light according to the methods described below.

According to a first method, the main surface of the transparent insulator substrate 12 opposite to that bonded to the single crystal silicon substrate 11 at Step d is made capable of scattering light, or the interior of the transparent insulator substrate 12 is made capable of scattering light.

In this method, a light-scattering capability can be imparted, for example, as follows.

The surface of the transparent insulator substrate 12 opposite to that bonded to the single crystal silicon substrate 11 at Step d is made a rough surface with, for example, irregularities with a size of about 0.1 μm or more. The method of forming such a rough surface is not particularly limited. The stage at which the rough surface is formed is not also particularly limited. For example, a transparent insulator substrate with at least one rough surface may be prepared at Step a of preparing the transparent insulator substrate 12, or a rough surface as described above may be formed at any of Steps a to i.

As an alternative, for example, a transparent material layer containing transparent fine particles with a diameter of about 0.1 μm or more and a refractive index different from that of the transparent insulator substrate 12 may be formed on the transparent insulator substrate 12.

As another alternative, for example, fine particles with a diameter of 0.1 μm or more and a refractive index different from that of the transparent insulator substrate 12 may be formed in the interior of the transparent insulator substrate 12.

According to a second method, the main surface of the transparent insulator substrate 12 bonded to the single crystal silicon substrate 11 at Step d is made capable of scattering light.

In the method for manufacturing a single crystal silicon solar cell according to the invention, the single crystal silicon substrate 11 and the transparent insulator substrate 12 are bonded using the transparent adhesive 15. Therefore, it is not essential to make the bonding surfaces of both the substrates highly planarized, so the bonding surfaces may be rough to some extent. Accordingly, a light-scattering capability can be imparted to the bonding surface of the transparent insulator substrate 12 by, for example, preparing a transparent insulator substrate having a rough bonding surface with, for example, irregularities with a size of about 0.1 μm or more, at Step a of preparing the transparent insulator substrate 12.

According to a third method, the transparent adhesive 15, when cured to form the transparent adhesive layer 16, is made capable of scattering light.

For example, a light-scattering capability can be imparted to the transparent adhesive layer 16 by incorporating into the transparent adhesive 15 fine transparent particles with a diameter of about 0.1 μm or more and a refractive index different from that of the transparent adhesive layer 16. Note that the entire transparent adhesive layer 16 does not need to be capable of scattering light, and only a portion of the transparent adhesive layer 16 may be capable of scattering light.

The above-described methods of making the light entry surface capable of scattering light can be used in combination.

In addition to these methods, for example, a light-scattering capability can be imparted to the light-receiving surface by making rough the surface of the single crystal silicon substrate 11 bonded to the transparent insulator substrate 12.

Note that the single crystal silicon substrate left after the delamination and transfer of the single crystal silicon layer 17 at Step e is subjected to a planarization and removal process by grinding the delaminated rough surface and the ion-implanted layer, and then subjected to a repeated ion implantation process. In this manner, the single crystal silicon substrate can be reused as a single crystal silicon substrate 11. Because the method for manufacturing a single crystal silicon solar cell of the invention does not require heating a single crystal silicon solar cell to 300° C. or higher from the ion implantation step to the delamination step, there is no possibility that oxygen-induced defects are introduced into the single crystal silicon substrate. For this reason, when a single crystal silicon substrate with a thickness of slightly less than 1 mm is initially used, the substrate can be repeatedly subjected to delamination and transfer 100 times or more, to obtain a single crystal silicon layer 17 with a thickness of 5 μm, or can also be repeatedly subjected to delamination and transfer 10 times or more, to obtain a single crystal silicon layer 17 with a thickness of 50 μm.

FIG. 2 (*a*) schematically shows the structure of the single crystal silicon solar cell 31 manufactured according to the method described above, and FIG. 2 (*b*) schematically shows the connection pattern of the electrodes of the single crystal silicon solar cell 31. As shown in FIGS. 2 (*a*) and (*b*), the single crystal silicon solar cell 31 comprises a stack having the light-reflecting film 28, single crystal silicon layer 17, transparent adhesive layer 16, and transparent insulator substrate 12. The plurality of areas 21 of the first conductivity type and the plurality of areas 22 of the second conductivity type are formed in the surface of the single crystal silicon layer 17 near the light-reflecting film 28 (delaminated surface), and the plurality of pn junctions are formed at least in the plane direction of the single crystal silicon layer (the normal to the pn junction interface at least has a component facing in the plane direction of the single crystal silicon layer 17). Each of the plurality of first individual electrodes 23 is formed on each one of the plurality of areas 21 of the first conductivity type, and each of the plurality of second individual electrodes 24 is formed on each one of the plurality of areas 22 of the second conductivity type in the single crystal silicon layer 17. The first collector electrode 25 for connecting the plurality of first individual electrodes 23 and the second collector electrode 26 for connecting the plurality of second individual electrodes 24 are formed.

Note that FIG. 2 shows the single crystal silicon solar cell 31 inverted from the position of FIG. 1 (*i*), with the light-receiving surface 29 at the top.

A seal layer 27 composed of silicon oxide, nitric oxide, or the like may also be formed so that each type of the electrodes is embedded therein.

In the solar cell 31 with this structure, light enters through the light-receiving surface 29, passes through the transparent adhesive layer 16 without being substantially absorbed, and is partly absorbed at the single crystal silicon layer 17, where the light is converted to electricity through the pn junctions, and the electricity is obtained through each of the electrodes.

Moreover, because the single crystal silicon solar cell 31 has the light-reflecting film 28 opposite to the light-receiving surface 29, even if part of the light incident from the light-receiving surface 29 passes through the single crystal silicon layer 17 without being absorbed, the light is allowed to pass through the single crystal silicon layer 17 again by the light-reflecting film 28, thus increasing the total light absorption. A so-called optical-confinement structure having such a reflective film or the like on the bottom surface is effective to enhance the conversion efficiency of a thin-film single crystal silicon solar cell that is made very thin using, as a light-converting layer, a single crystal silicon layer with a light absorption significantly lower than that of amorphous silicon.

In addition, a light-scattering layer may be provided on the light-receiving surface by the above-described methods. That is to say, the interior of the transparent insulator substrate 12 or the surface thereof opposite to the single crystal silicon layer 17 (light-receiving surface 29) may be capable of scattering light; the surface of the transparent insulator substrate 12 near the single crystal silicon layer 17 may be capable of scattering light; or the transparent adhesive layer 16 may be capable of scattering light. This results in an optical-confinement structure whereby light is scattered to further extend the optical path length of the light incident on the single crystal silicon layer 17, thereby enabling the single crystal silicon layer 17 to absorb more light. As a result, the conversion efficiency of the solar cell can be enhanced.

Furthermore, by making the thickness of the single crystal silicon layer 17 of not less than 2 µm and not more than 50 µm, for example, according to the above-described method, the resulting single crystal silicon solar cell exhibits a practical efficiency as a thin-film single crystal silicon solar cell, while sufficiently saving the amount of the silicon raw material used.

EXAMPLES

Example 1

A single crystal silicon substrate with a diameter of 200 mm (8 inches), the crystal plane (100), the p-type conductivity, and a surface resistance of 15 Ωcm was prepared as a single crystal silicon substrate 11. A quartz glass substrate with a diameter of 200 mm (8 inches) and a thickness of 2.5 mm was also prepared as a transparent insulator substrate 12 (Step a).

$H^+$ ions were then implanted into one main surface of the single crystal silicon substrate 11 at a dose of $1.0 \times 10^{17}/cm^2$ and at an energy level of 350 keV (Step b). An ion-implanted layer 14 was thus formed at a depth of about 3 µm from the ion-implanted surface 13.

A polycondensate was obtained by hydrolysis and polycondensation of an alkyltrialkoxysilane and a tetraalkoxysilane using hydrochloric acid as a catalyst. The product was dissolved in isopropyl alcohol solvent to give a transparent adhesive (silicone resin). The single crystal silicon 11 and the quartz glass substrate 12 were brought in close contact via the transparent adhesive 15 (Step c).

The bonded substrate was heat-treated at 250° C. for two hours, and then returned to room temperature, thereby curing the transparent adhesive 15 to form a transparent adhesive layer 16. Simultaneously, the single crystal silicon 11 and the quartz glass substrate 12 were firmly bonded (Step d).

A high-pressure nitrogen gas was then applied near the ion-implanted layer at room temperature, and then the single crystal silicon substrate was mechanically delaminated so that delamination started from the nitrogen gas-applied surface (Step e). The delamination was performed after adhering an auxiliary substrate to the rear surface of each of the single crystal silicon substrate and the quartz glass substrate. The single crystal silicon layer 17 obtained through delamination and transfer was subsequently heat-treated by a flash-lamp annealing method so that the surface thereof was instantaneously heated to 700° C. or higher, to recover the damage due to hydrogen implantation.

Using a diffusion paste containing phosphorus glass and ethylcellosolve as a thickener, a pattern with a line width of 50 µm was formed on the surface of the single crystal silicon layer 17 at an interval of 1 mm by a screen printing method. The pattern was subjected to flash-lamp radiation so that the surface thereof was instantaneously heated to 600° C. or higher, thereby forming a plurality of n-type diffusion areas 22 at a junction depth of about 0.2 µm (Step f). This resulted in the p-type areas 21 and the n-type areas 22 being alternately present on the surface of the single crystal silicon layer 17, and a plurality of pn junctions being formed in the plane direction of the single crystal silicon layer.

After removing and cleaning the diffusion paste with fluoric acid and acetone or isopropyl alcohol, each of a plurality of first individual electrodes 23 was formed on each one of the plurality of p-type areas 21, and each of a plurality of second individual electrodes 24 was formed on each one of the plurality of n-type areas 22, using silver as an electrode material, by a vacuum evaporation method and a patterning method (Step g).

After this, using silver as an electrode material, a first collector electrode 25 was formed to connect the plurality of first individual electrodes 23, and a second collector electrode 26 was formed to connect the plurality of second individual electrodes 24, by a vacuum evaporation method employing a metal mask (Step h).

A silicon nitride coating as a seal layer 27 was then formed, using a reactive sputtering method, on the surface of the single crystal silicon layer 17 excluding the portion of the electrodes through which electricity is obtained. An alumite-treated aluminum film was then bonded as a light-reflecting film 28 onto the seal layer 27 via polyvinyl butyral as an adhesive (Step i).

In this manner, the thin-film single crystal silicon solar cell 31 shown in FIGS. 2 (a) and (b) was fabricated. The solar cell 31 comprises a stack having the aluminum light-reflecting film 28, silicon nitride seal layer 27, single crystal silicon layer 17, transparent adhesive layer 16, and quartz glass substrate 12. The plurality of p-type areas 21 and the plurality of n-type areas 22 are formed in the surface of the single crystal silicon layer 17 near the light-reflecting film 28, and the plurality of pn junctions are formed at least in the plane direction of the single crystal silicon layer. Each of the plurality of first individual electrodes 23 is formed on each one of the plurality of p-type areas 21, and each of the plurality of second individual electrodes 24 is formed on each one of the plurality of n-type areas 22 on the single crystal silicon layer 17. The first collector electrode 25 for connecting the plurality of first individual electrodes 23 and the second collector electrode 26 for connecting the plurality of second individual electrodes 24 are formed.

The single crystal silicon solar cell thus fabricated was irradiated with 100 mW/cm² of light through the light-receiving surface 29 of the quartz glass substrate 12, using a solar simulator at AM 1.5, to measure the conversion efficiency. The conversion efficiency was 12.5% without any change over time.

Although the light-converting layer was as thin as 3 µm, the thin-film single crystal silicon solar cell exhibited a high conversion efficiency. Such a high conversion efficiency was considered to be obtained because the silicon layer serving as a light-converting layer was composed of single crystal silicon with satisfactory crystallinity, and the optical-confinement structure was employed.

Example 2

A light-scattering layer was additionally formed on a light-receiving surface 29 of a quartz glass substrate 12 of a single crystal silicon solar cell as fabricated in Example 1, as follows. A polycondensate resin which was obtained by hydrolysis and polycondensation of an alkyltrialkoxysilane and a tetraalkoxysilane using hydrochloric acid as a catalyst, and which contained 60% by weight of zirconium oxide particles with an average particle size of 0.3 µm and a refractive index of 2.4, was dissolved in isopropyl alcohol solvent to form a transparent resin material. The transparent resin material was then applied onto the quartz glass substrate 12 to a thickness of 2 μm.

The single crystal silicon solar cell thus having a light-scattering capability on the light-receiving surface 29 of the quartz glass substrate 12 was measured for conversion efficiency in the same manner as in Example 1. As a result, the conversion efficiency was 15% without any change over time.

Owing to a further improvement in the optical-confinement structure, the conversion efficiency became higher than that of Example 1.

Example 3

A thin-film single crystal silicon solar cell 31 was fabricated in the same manner as in Example 1, except that a quartz glass substrate 12 in which both surfaces have irregularities with a size of about 0.1 μm was used.

The single crystal silicon solar cell thus having a light-scattering capability on the interface of the quartz glass substrate 12 with the transparent adhesive layer 16 was measured for conversion efficiency in the same manner as in Example 1. As a result, the conversion efficiency was 16% without any change over time.

Owing to a further improvement in the optical-confinement structure, the conversion efficiency became higher than that of Example 1.

Example 4

A thin-film single crystal silicon solar cell 31 was fabricated in the same manner as in Example 1, except that, as a transparent adhesive 15, a transparent resin material prepared by dissolving in isopropyl alcohol solvent a polycondensate resin which was obtained by hydrolysis and polycondensation of an alkyltrialkoxysilane and a tetraalkoxysilane using hydrochloric acid as a catalyst, and which contained 60% by weight of zirconium oxide particles with an average particle size of 0.3 μm and a refractive index of 2.4 (the same transparent resin material as that used in Example 2 above), and that the thickness of the transparent adhesive 15 was 3 μm.

The single crystal silicon solar cell thus having a light-scattering capability on the transparent adhesive layer 16 was measured for conversion efficiency in the same manner as in Example 1. As a result, the conversion efficiency was 16% without any change over time.

Owing to a further improvement in the optical-confinement structure, the conversion efficiency became higher than that of Example 1.

Comparative Example

The same procedure as that of Example 1 was performed until Step i of forming a seal layer 27 of silicon nitride. A PET film instead of an aluminum film was then bonded onto the seal layer 27 using polyvinyl butyral as an adhesive.

The single crystal silicon solar cell thus fabricated was measured for conversion efficiency in the same manner as the Examples. As a result, the conversion efficiency was 10%.

The conversion efficiency was lower than those obtained in Examples 1 to 4, which revealed that the optical-confinement structure as employed in the present invention contributes to improvements in the conversion efficiency of a thin-film single crystal silicon solar cell.

Note that the present invention is not limited to the above-described embodiments. The above-described embodiments are merely illustrative, and any invention that has substantially the same structure as, and attains similar working-effects to, those set forth in the claims of the invention will be encompassed within the technical concept of the invention.

What is claimed is:

1. A method for manufacturing a single crystal silicon solar cell;
the single crystal silicon solar cell comprising a stack having at least a light-reflecting film, a single crystal silicon layer serving as a light-converting film, and a transparent insulator substrate; and a surface of the side of the transparent insulator substrate being a light-receiving surface;
the method comprising at least the steps of:
preparing a transparent insulator substrate and a single crystal silicon substrate of a first conductivity type;
implanting at least either hydrogen ions or rare-gas ions into the single crystal silicon substrate to form an ion-implanted layer, wherein rare-gas ions is at least one ion selected from the group consisting of helium, neon, argon, krypton, xenon, and radon;
bringing the ion-implanted surface of the single crystal silicon substrate in close contact with the transparent insulator substrate via a transparent adhesive;
curing the transparent adhesive to form a transparent adhesive layer, and simultaneously, bonding the single crystal silicon substrate and the transparent insulator substrate;
applying an impact to the ion-implanted layer to mechanically delaminate the single crystal silicon substrate, thereby forming a single crystal silicon layer;
forming a plurality of diffusion areas of a second conductivity type different from the first conductivity type in the delaminated surface side of the single crystal silicon layer to form a plurality of pn junctions at least in a plane direction of the single crystal silicon layer, and simultaneously, causing a plurality of areas of the first conductivity type and the plurality of areas of the second conductivity type to be present in the delaminated surface of the single crystal silicon layer;
forming each of a plurality of first individual electrodes on each one of the plurality of areas of the first conductivity type, and forming each of a plurality of second individual electrodes on each one of the plurality of areas of the second conductivity type in the single crystal silicon layer;
forming a first collector electrode for connecting the plurality of first individual electrodes, and a second collector electrode for connecting the plurality of second individual electrodes; and
forming a light-reflecting film on a surface of the single crystal silicon layer on which the plurality of areas of the first conductivity type and the plurality of areas of the second conductivity type are formed.

2. The method for manufacturing a single crystal silicon solar cell according to claim 1, wherein the transparent insulator substrate is composed of any of quartz glass, crystallized glass, borosilicate glass, and soda-lime glass.

3. The method for manufacturing a single crystal silicon solar cell according to claim 1, wherein the transparent adhesive contains at least one resin selected from the group consisting of silicone resin, acrylic resin, cycloaliphatic acrylic resin, liquid crystal polymer, polycarbonate, and polyethylene terephthalate.

4. The method for manufacturing a single crystal silicon solar cell according to claim 2, wherein the transparent adhesive contains at least one resin selected from the group consisting of silicone resin, acrylic resin, cycloaliphatic acrylic resin, liquid crystal polymer, polycarbonate, and polyethylene terephthalate.

5. The method for manufacturing a single crystal silicon solar cell according to claim 1, wherein the ion-implanted layer has a depth of not less than 2 μm and not more than 50 μm from the ion-implanted surface.

6. The method for manufacturing a single crystal silicon solar cell according to claim 4, wherein the ion-implanted layer has a depth of not less than 2 μm and not more than 50 μm from the ion-implanted surface.

7. The method for manufacturing a single crystal silicon solar cell according to claim 1, wherein an interior of the transparent insulator substrate or a surface of the transparent insulator substrate opposite to a surface bonded to the single crystal silicon substrate is capable of scattering light.

8. The method for manufacturing a single crystal silicon solar cell according to claim 6, wherein an interior of the transparent insulator substrate or a surface of the transparent insulator substrate opposite to a surface bonded to the single crystal silicon substrate is capable of scattering light.

9. The method for manufacturing a single crystal silicon solar cell according to claim 1, wherein the surface of the transparent insulator substrate bonded to the single crystal silicon substrate is capable of scattering light.

10. The method for manufacturing a single crystal silicon solar cell according to claim 8, wherein the surface of the transparent insulator substrate bonded to the single crystal silicon substrate is capable of scattering light.

11. The method for manufacturing a single crystal silicon solar cell according to claim 1, wherein the transparent adhesive, when cured to form the transparent adhesive layer, is capable of scattering light.

12. The method for manufacturing a single crystal silicon solar cell according to claim 10, wherein the transparent adhesive, when cured to form the transparent adhesive layer, is capable of scattering light.

13. A single crystal silicon solar cell which is manufactured by the method according to claim 1.

14. The method for manufacturing a single crystal silicon solar cell according to claim 1, wherein if the light-reflecting film is formed of metal, a transparent sealing layer is formed after forming the first collector electrode and the second collector electrode and before forming the light-reflecting film, the transparent sealing layer burying the electrodes formed on the single crystal silicon layer.

15. The method for manufacturing a single crystal silicon solar cell according to claim 1, wherein if the light-reflecting film is formed of an insulating material, the light-reflecting film is formed to bury the electrodes formed on the single crystal silicon layer.

* * * * *